US009396297B2

(12) United States Patent
Kang

(10) Patent No.: US 9,396,297 B2
(45) Date of Patent: Jul. 19, 2016

(54) METHOD OF SIMULATING SEMICONDUCTOR DEVICES AND METHOD OF DESIGNING SEMICONDUCTOR DEVICES USING THE SAME

(71) Applicant: SAMSUNG ELECTRONICS CO., LTD., Suwon-si (KR)

(72) Inventor: Mi-Hyun Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/523,356

(22) Filed: Oct. 24, 2014

(65) Prior Publication Data

US 2015/0205897 A1    Jul. 23, 2015

(30) Foreign Application Priority Data

Jan. 22, 2014    (KR) .......................... 10-2014-0007975

(51) Int. Cl.
 G06F 17/50    (2006.01)
(52) U.S. Cl.
 CPC ........ *G06F 17/5036* (2013.01); *G06F 17/5045* (2013.01)
(58) Field of Classification Search
 CPC ........... H01L 2224/48227; H01L 2224/73265; H01L 2924/13091; H01L 2924/1305; H01L 2924/13062; C12Q 1/6869; C12Q 1/6874; C12Q 2565/301; G11C 16/0483; G11C 11/41; G11C 16/10; G11C 29/82; G06F 17/5036
 USPC ................................. 716/100–106
 See application file for complete search history.

(56) References Cited

U.S. PATENT DOCUMENTS

| 6,081,662 | A | 6/2000 | Murakami et al. |
| 6,100,143 | A | 8/2000 | Brown et al. |
| 7,194,394 | B2 | 3/2007 | Dorfman et al. |
| 8,701,054 | B2 * | 4/2014 | Moroz ................. H01L 21/266 716/118 |
| 2004/0040000 | A1 * | 2/2004 | Taravade ............. G06F 17/5036 716/53 |
| 2010/0306719 | A1 * | 12/2010 | Smayling ............ G06F 17/5081 716/136 |
| 2012/0306546 | A1 | 12/2012 | Sakakibara |

FOREIGN PATENT DOCUMENTS

| JP | 2003-163222 A | 6/2003 |
| JP | 2004-119633 A | 4/2004 |
| JP | 2005-340235 A | 12/2005 |
| JP | 2009-164538 A | 7/2009 |
| KR | 10-0716912 B1 | 5/2007 |
| KR | 10-1093623 B1 | 12/2011 |

* cited by examiner

*Primary Examiner* — Binh Tat
(74) *Attorney, Agent, or Firm* — Sughrue Mion, PLLC

(57) ABSTRACT

Provided are an apparatus and a method for simulating a semiconductor device. The method includes: modeling, through an input interface of a simulation device, a flat transistor as a first transistor; modeling, through the input interface, a first corner transistor as a second transistor; and calculating, by a processor of the simulation device, an output electrical signal in response to an input electrical signal applied to the first transistor and the second transistor to simulate at least one electrical characteristic of the semiconductor device. The flat transistor is formed by an active region defined by an isolation region on a semiconductor substrate, a gate electrode extending from the isolation region across the active region, and an impurity region in a portion of the active region. The first corner transistor is formed by an overlapping of the gate electrode and a first edge portion of the active region.

20 Claims, 15 Drawing Sheets

METHOD OF SIMULATING SEMICONDUCTOR DEVICES AND METHOD OF DESIGNING SEMICONDUCTOR DEVICES USING THE SAME

CROSS-REFERENCE TO RELATED APPLICATION

This application claims priority from Korean Patent Application No. 10-2014-0007975, filed on Jan. 22, 2014 in the Korean Intellectual Property Office (KIPO), the content of which is herein incorporated by reference in its entirety.

BACKGROUND

1. Technical Field

Apparatuses and methods consistent with exemplary embodiments relate generally to semiconductor devices, and more particularly to a method of simulating a semiconductor device and a method of designing a semiconductor device using the same.

2. Description of the Related Art

As a manufacturing process of semiconductor devices has become more and more minutely detailed, various undesired electrical characteristics occur in the semiconductor devices. Since the various undesired electrical characteristics are not reflected in a related art simulation device, there is a huge difference of measured electrical characteristics between an actual device and a simulated device.

SUMMARY

Aspects of one or more exemplary embodiments provide a method of simulating a semiconductor device, which is capable of reflecting undesired electrical characteristics practically.

Aspects of one or more exemplary embodiments provide a method of designing a semiconductor device, capable of alleviating undesired electrical characteristics, using the simulation method.

According to an aspect of an exemplary embodiment, there is provided a method of simulating a semiconductor device, the method including: modeling, through an input interface of a simulation device, a flat transistor as a first transistor; modeling, through the input interface, a first corner transistor as a second transistor; and calculating, by a processor of the simulation device, an electrical output signal in response to an electrical input signal applied to the first transistor and the second transistor to simulate at least one electrical characteristic of the semiconductor device. The flat transistor is formed by an active region defined by an isolation region on a semiconductor substrate, a gate electrode extending from the isolation region across the active region, and an impurity region in a portion of the active region. The first corner transistor is formed by an overlapping of the gate electrode and an edge portion of the active region.

The flat transistor may be modeled as the first transistor by inputting, through the input interface, a first device parameter of the flat transistor to a memory of the simulation device, and the first corner transistor may be modeled as the second transistor by inputting, through the input interface, a second device parameter of the first corner transistor to the memory.

The first device parameter may include at least one of a first channel width, a first channel length, and a first gate oxide thickness of the first transistor.

The second device parameter may include at least one of a second channel width, a second channel length, and a second gate oxide thickness of the second transistor.

A ratio between the first transistor and the second transistor may be adjusted by adjusting, through the input interface, a first channel width of the first device parameter and a second channel width of the second device parameter.

The method may further include modeling, through the input interface, a second corner transistor as a third transistor. The second corner transistor may be formed by an overlapping of the gate electrode and a second edge portion of the active region, opposite to the first edge portion of the active region.

The second corner transistor maybe modeled as the third transistor by inputting, through the input interface, a third device parameter of the second corner transistor to the memory.

A ratio between the first transistor and the second and third transistors may be adjusted by adjusting, through the input interface, a first channel width of the first device parameter, a second channel width of the second device parameter, and a third channel width of the third parameter.

The semiconductor device may be a metal-oxide semiconductor (MOS) transistor and the at least one electrical characteristic may include a hump phenomenon of the MOS transistor.

The electrical input signal may correspond to a voltage applied to a common gate of the first transistor and the second transistor, and the electrical output signal may correspond to a drain current in response to the voltage.

The method may further include displaying the calculated electrical output signal through an output interface of the simulation device.

According to an aspect of another exemplary embodiment, there is provided a method of designing a semiconductor device to be manufactured, the method including: modeling, through an input interface of a simulation device, a semiconductor device as a first transistor and a second transistor; calculating, by a processor of the simulation device, an electrical output signal in response to an electrical input signal applied to the first transistor and the second transistor to simulate at least one electrical characteristic of the semiconductor device; and determining a manufacturing process of the semiconductor device based on the simulated at least one electrical characteristic. The first transistor corresponds to a flat transistor in a center portion of an active region, and the second transistor corresponds to a first corner transistor formed in a first edge portion of the active region.

The semiconductor device to be manufactured may be a metal-oxide semiconductor (MOS) transistor and the at least one electrical characteristic may include a hump phenomenon of the MOS transistor.

The determining the manufacturing process may include determining to form at least one channel formation preventing portion in a gate electrode across the active region such that a channel is prevented from being formed at the first edge portion of the active region.

The method may further include: modeling, through the input interface, a third transistor in addition to the first transistor and the second transistor, the third transistor corresponding to a second corner transistor at a second edge portion of the active region; and adjusting a ratio between the first transistor and the second and third transistors by inputting, through the input interface, a first device parameter of the first transistor, a second device parameter of the second transistor, and a third device parameter of the third transistor, respectively, to the memory.

According to an aspect of another exemplary embodiment, there is provided an apparatus for simulating a semiconductor device, the apparatus including: an input interface configured to receive a first input to model a first transistor and a second input to model second transistor; and a processor configured to calculate an electrical output signal in response to an electrical input signal applied to the first transistor and the second transistor to simulate at least one electrical characteristic of the semiconductor device, wherein the first transistor corresponds to a flat transistor in a center portion of an active region of the semiconductor device, and the second transistor corresponds to a first corner transistor in a first edge portion of the active region.

Accordingly, the hump phenomenon of a subject semiconductor device may be reflected in the simulation by modeling a flat transistor and a corner transistor of the subject semiconductor device as a first transistor and a second transistor, respectively.

BRIEF DESCRIPTION OF THE DRAWINGS

Features will become apparent to those of ordinary skill in the art by describing in detail exemplary embodiments with reference to the attached drawings in which.

DETAILED DESCRIPTION OF EXEMPLARY EMBODIMENTS

Figure 1:
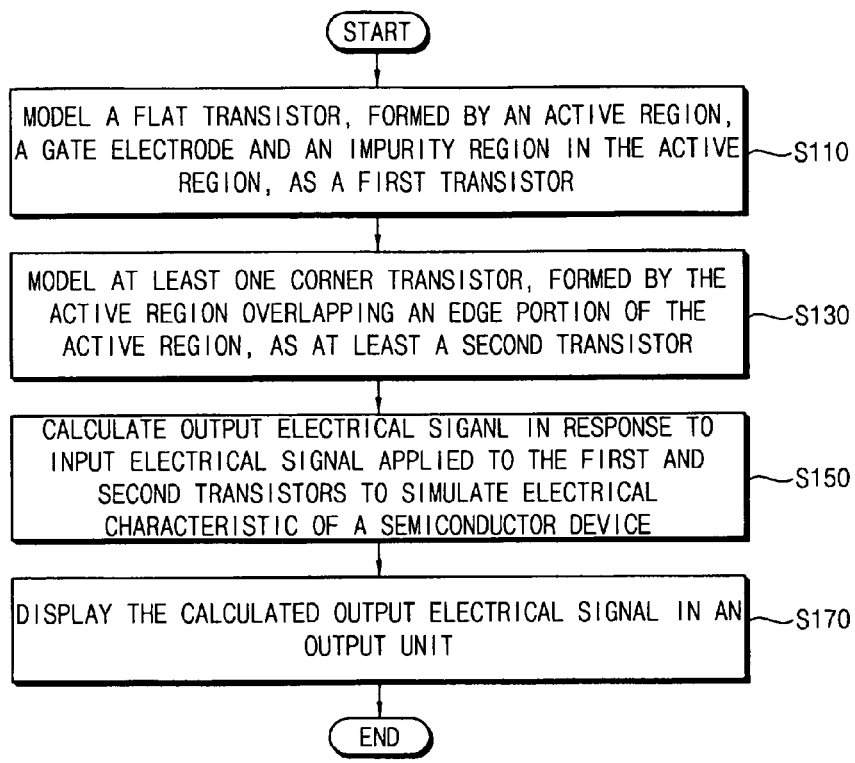
FIG. 1 is a flowchart illustrating a method of simulating a semiconductor device according to an exemplary embodiment.

Various exemplary embodiments will be described more fully with reference to the accompanying drawings, in which exemplary embodiments are shown. This present disclosure may, however, be embodied in many different forms and should not be construed as limited to exemplary embodiments set forth herein. Rather, these exemplary embodiments are provided so that this disclosure will be thorough and complete, and will fully convey the scope of the present disclosure to those skilled in the art Like reference numerals refer to like elements throughout this application.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items. Furthermore, as used herein, expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described in detail with reference to accompanying drawings. The same reference numerals will be assigned to the same elements, and the details thereof will be omitted in order to avoid redundancy.

A circuit analyzing simulator will now be described.

In semiconductor device circuit design, circuit characteristics are generally predicted by using a circuit analyzing simulator. For example, the related art Simulation Program with Integrated Circuit Emphasis (SPICE) created by the University of California, Berkeley (UCB), may be used as a software tool for circuit simulation. A device model used in this simulator is generally called a compact model that is simplified in order to obtain calculation results within a relatively short time.

Under such circumstances, for a metal-oxide semiconductor (MOS) transistor that changes the impedance between the source and drain regions by controlling the surface charge density of a semiconductor layer via changing its surface potential by the gate voltage, a general approach is to use different voltage-current expressions in a weak inversion region (sub-threshold—weak inversion region), in which the gate voltage is relatively low and the drain current starts flowing, and a strong inversion region, in which the gate voltage is sufficiently high and the drain current is large.

Representative transistor models derived from this technical approach are a series called Berkeley Short-Channel IGFET Model (BSIM) (e.g., BSIM 4.3.0 MOSFET Model, User's Manual, Department of Electrical Engineering and Computer Science, University of California, Berkeley, Calif. [2003]). Of the drain current as the sum of a diffusion current and drift current, these models use only the diffusion current in the weak inversion region where the diffusion current component is dominant, and use only the drift current in the strong inversion region where the drift current is dominant.

That is, diffusion current approximation is performed in the weak inversion region as indicated by the following Equation 1.

$$I_D = I_{on} \exp\left(\frac{V_{GS} - V_{on}}{\zeta V_T}\right) \quad \text{[Equation 1]}$$

Drift current approximation is performed in the strong inversion region as indicated by the following Equation 2.

$$Z_D = \mu C_{ox} \frac{x}{L}\left\{(V_{GS} - V_{TH0})V_{DS} - \frac{V_{DS}^2}{2} - \frac{2}{3}\gamma\left[(V_{DS} - V_{BS} + 2\phi_F)^{\frac{3}{2}} - (-V_{BS} + 2\phi_F)^{\frac{3}{2}}\right]\right\}, \quad \text{[Equation 2]}$$

where $I_D$ is the drain current, $I_{on}$ is a diffusion current exponential function coefficient, $V_{GS}$ is the gate-to-source voltage, $V_{on}$ is the diffusion current offset voltage, $\zeta$ is a diffusion current thermal voltage coefficient, $V_T$ is the thermal voltage, $\mu$ is the carrier mobility, $C_{ox}$ is the gate oxide film capacitance, W is the channel width, L is the channel length, $V_{TH0}$ is the threshold voltage, $V_{DS}$ is the drain-to-source voltage, $\gamma$ is a coefficient of the substrate biasing effect, $V_{BS}$ is the substrate (bulk)-to-source voltage, and $\phi_F$ is the Fermi level.

Using different expressions to calculate currents in different operating regions as described above simplifies the expressions and facilitates the analysis. This makes it possible to shorten the calculation time.

Attempts have been made to solve the drift diffusion model expression as the basic expression of a current without separating the expression in accordance with an operating region. A representative attempt is a related art model called the Hiroshima University STARC IGFET Model (HiSIM). This model uses a method of calculating the surface charge by deriving the surface potential by a single expression (diffusion-drift expression) in the operation from weak inversion to strong inversion of a transistor (MOSFET), thereby obtaining a current.

Basic equations for the inversion layer charge Qi and the depletion layer charge Qb at position y along the channel with the effective gate voltage $V_G'$ are as indicated by the following Equation 3 and Equation 4.

$$Qi(y) = -C_{ox}(V_G' - \phi_S(y)) - Q_b(y), \quad \text{[Equation 3]}$$

$$Q_b(y) = -qN_{sub}L_D\sqrt{2\beta(\phi_S(y) - V_{BS}) - 1}, \quad \text{[Equation 4]}$$

where q, $C_{ox}$, $N_{sub}$, $L_D$, $\phi_S$ are the electrical charge, the oxide capacitance, the substrate doping concentration, the Debye length, and the surface potential, respectively, at position y. In addition, $V_{BS}$ is the substrate (bulk)-to-source voltage and $\beta$ is the thermal voltage. Due to the charge neutrality, the gate charge Qg is the negative sum of Qi and Qb.

The inclusion of the short-channel effect is done by introducing the lateral electrical field Ey as indicated by following Equation 5 to Equation 7.

$$V_G' = V_{gs} + \Delta V_G' - V_{fb}, \quad \text{[Equation 5]}$$

$$\Delta V_G' = \frac{\epsilon_{si}}{C_{ox}}\sqrt{\frac{2\epsilon_{si}}{qN_{sub}}(\phi_S(y) - V_{BS})}\,E_{yy}, \quad \text{[Equation 6]}$$

$$E_{yy} = \frac{dE_y}{dy}, \quad \text{[Equation 7]}$$

where Vfb is the flat-band voltage. The gradient of the lateral electrical field Eyy is extracted from measured threshold voltage (Vth). At threshold, $\Delta V_G'$ is represented by $\Delta$Vth.

The surface potential at a position L may be as indicated by following Equation 8.

$$\beta\phi_{SL} = \beta\phi_{S0} + \beta V_{BS} + \ln\frac{Qi(L)}{Qi(0)}, \quad \text{[Equation 8]}$$

where the potential $\phi_{SL}$ may be obtained by solving the Poisson equation and $V_{DS}$ is the drain-to-source voltage.

FIG. 1 is a flowchart illustrating a method of simulating a semiconductor device according to an exemplary embodiment.

Figure 2:
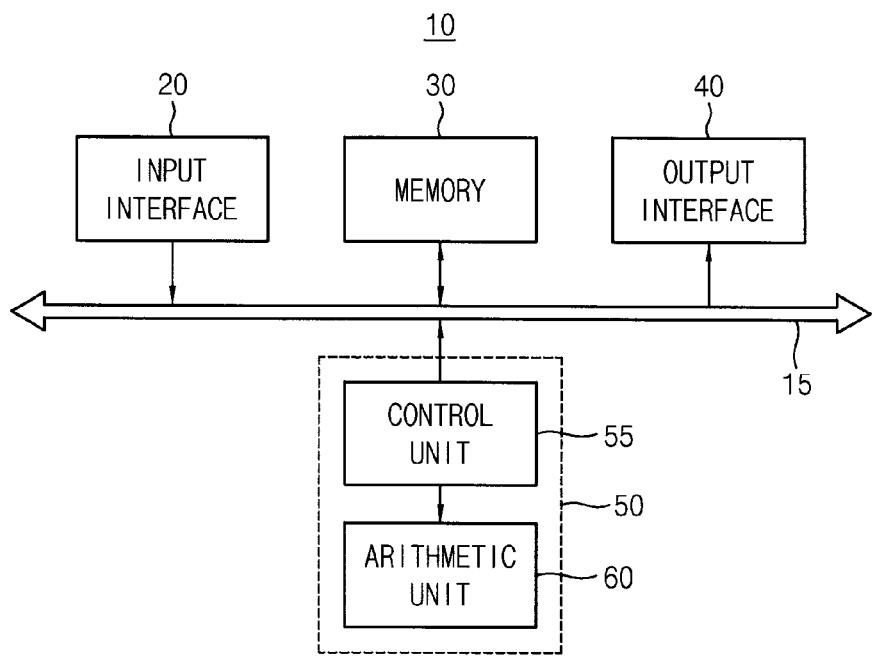
FIG. 2 is a block diagram illustrating a simulation device that performs the simulating method according to an exemplary embodiment.

FIG. 2 is a block diagram illustrating a simulation device that performs the simulating method according to an exemplary embodiment.

Referring to FIG. 2, a simulation device 10 includes an input interface (e.g., input unit) 20, a memory (e.g., storage unit) 30, an output interface (e.g., output unit) 40, and a processor (e.g., processing unit) 50. The processor 50 includes a controller (control unit) 55 and an arithmetic unit 60. The input interface 20, the memory 30, the output interface 40, and the processor 50 are connected to each other via a bus 15, and the controller 55 may control the input interface 20, the memory 30, the output interface 40, and the arithmetic unit 60.

The input interface 20, for example, may be a keyboard, an operation panel, a voice input unit, and/or any kind of various data readers or receivers. The memory 30 may be a semiconductor memory or a hard disk. The output interface 40 may be a monitor, a printer, a recorder, and/or the like.

The memory 30 may store, as one or more programs, various operation equations, analysis equations, and relational equations that represent characteristics of a semiconductor device to be simulated (for example, a metal-oxide semiconductor (MOS) transistor). For example, the memory 30 may store at least one of Equation 1 through Equation 8 as one or more programs. In addition, the memory 30 may store an operation result, which may be a simulation result of the semiconductor device to be simulated.

Figure 3:
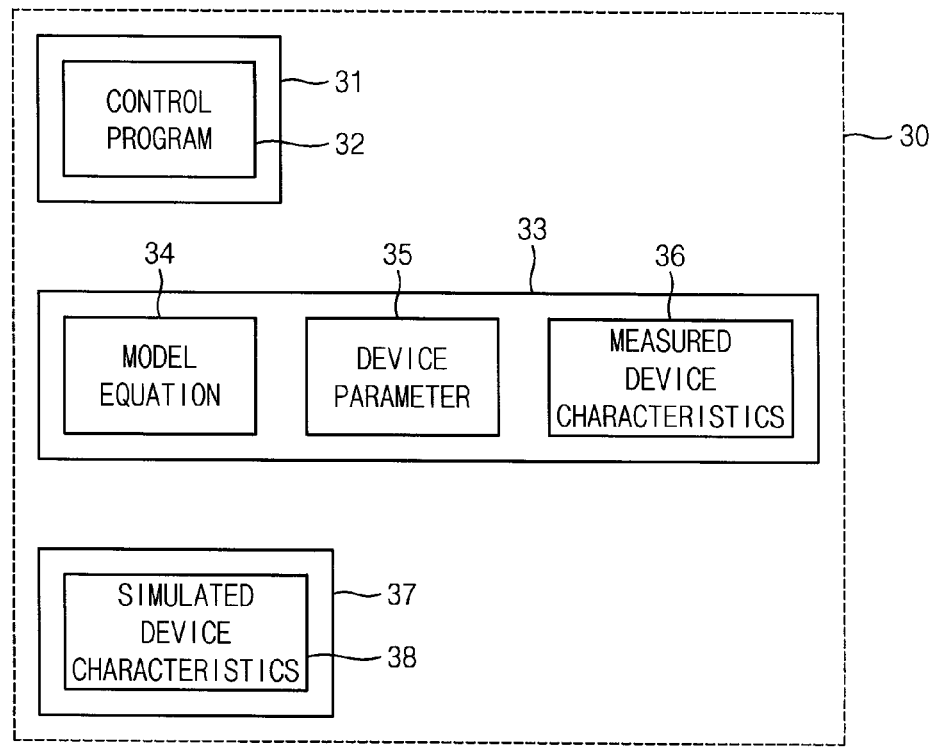
FIG. 3 illustrates an example of the memory illustrated in FIG. 2.

FIG. 3 illustrates an example of the memory 30 illustrated in FIG. 2.

Referring to FIG. 3, the memory 30 stores first through third files 31, 33 and 37. The first file 31 records data such as a control program 32 that is used for the controller 55 to control the input interface 20, the memory 30, the output interface 40, and the arithmetic unit 60. The second file 33 records data such as a device model equation 34 including Equation 1 through Equation 8 for simulating the semiconductor device to be simulated as a program. The second file 33 also records data such as a device parameter 35 including the channel width, the channel length, the thermal voltage, the carrier mobility, the gate oxide capacitance, the threshold voltage, the coefficient of the substrate biasing effect, the drain-to-source voltage, the substrate (bulk)-to-source voltage, and the Fermi level which are input by the input interface 20 for simulating the semiconductor device. In addition, the second file 33 records data such as measured device characteristics 36 by the input interface 20, which correspond to actually measured data of the semiconductor device. The third file 37 records data such as simulated device characteristics that correspond to an output voltage signal calculated in the arithmetic unit 60 in response to an input voltage signal. The arithmetic unit 60 may calculate the output voltage signal using at least some of Equation 1 through Equation 8 stored in the memory 30 under control of the controller 55.

Figure 4:
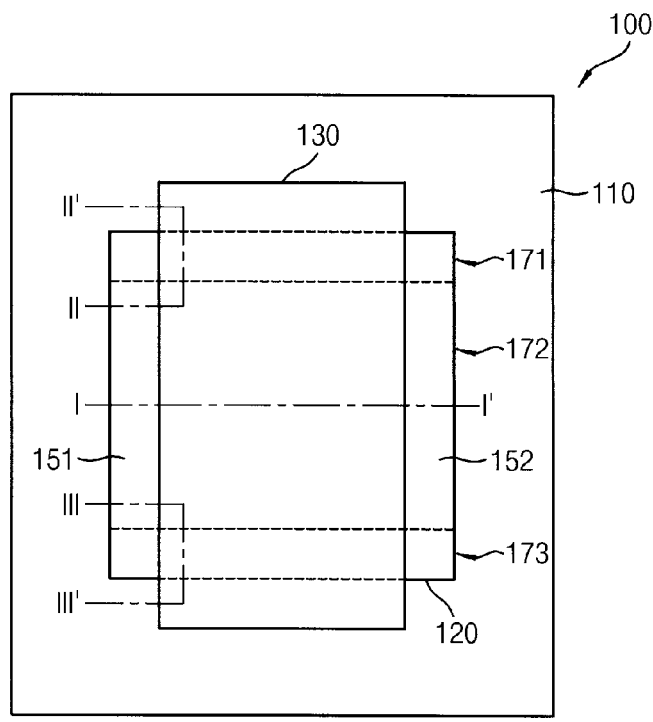
FIG. 4 is a plan view of a semiconductor device to be simulated according to an exemplary embodiment.
Figure 5:
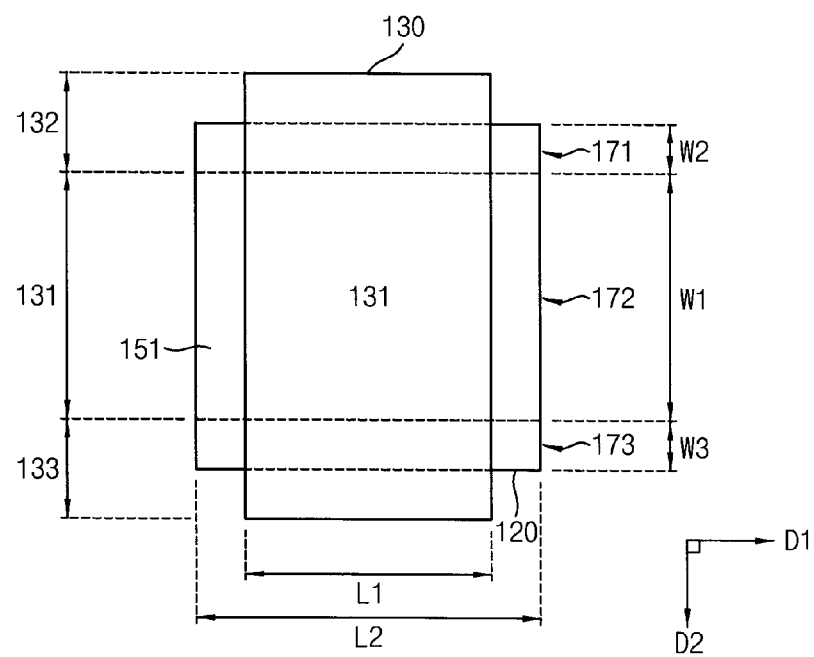
FIG. 5 is a plan view illustrating a portion of the semiconductor device of FIG. 4.
Figure 6:
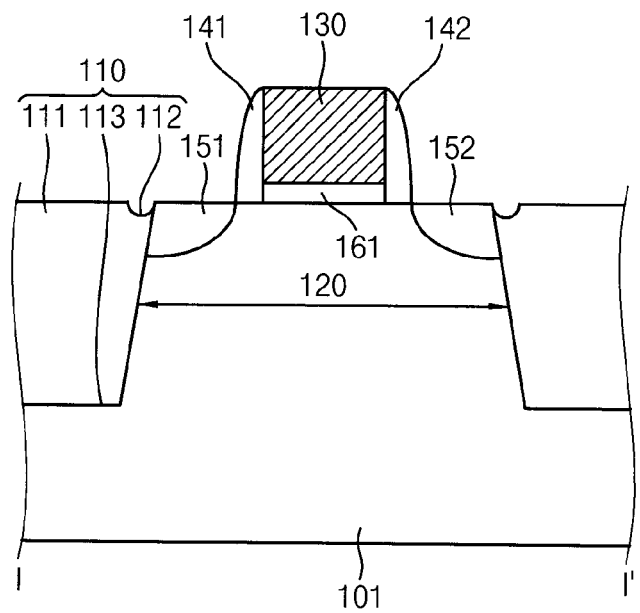
FIG. 6 is a cross-sectional view taken along a line I-I' in the semiconductor device of FIG. 4.
Figure 7:
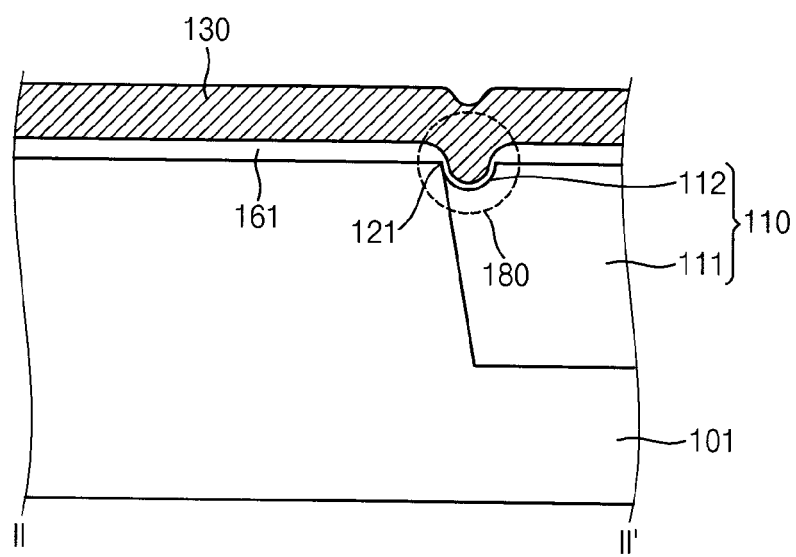
FIG. 7 is a cross-sectional view taken along a line II-II' in the semiconductor device of FIG. 4.
Figure 8:
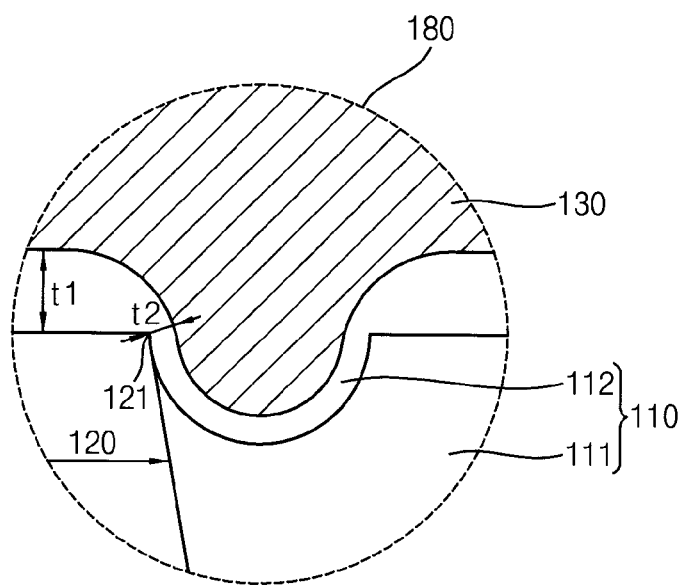
FIG. 8 is an enlarged view of a portion of the semiconductor device of FIG. 7.
Figure 9:
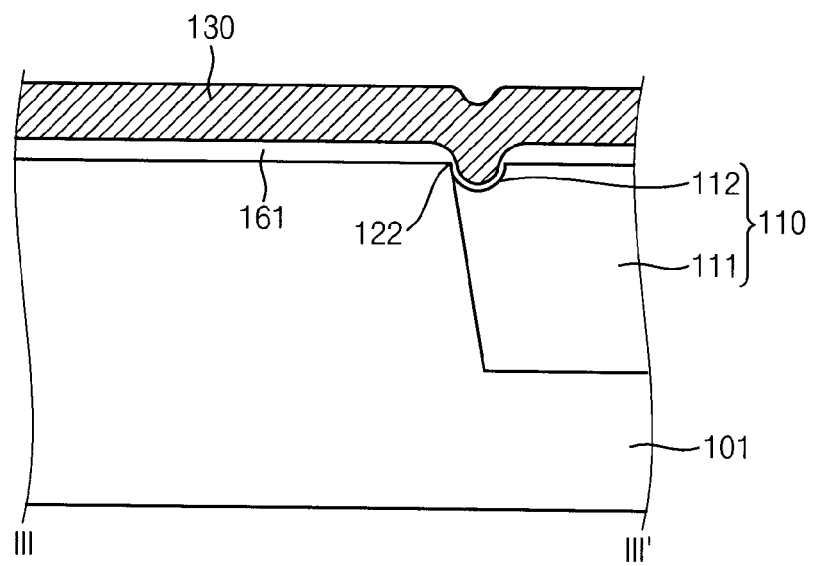
FIG. 9 is a cross-sectional view taken along a line III-III' in the semiconductor device of FIG. 4.

FIG. 4 is a plan view of a semiconductor device to be simulated according to an exemplary embodiment, FIG. 5 is a plan view illustrating a portion of the semiconductor device 100 of FIG. 4, FIG. 6 is a cross-sectional view taken along a line I-I' in the semiconductor device 100 of FIG. 4, FIG. 7 is a cross-sectional view taken along a line II-II' in the semiconductor device 100 of FIG. 4, FIG. 8 is an enlarged view of a portion of the semiconductor device 100 of FIG. 7, and FIG. 9 is a cross-sectional view taken along a line III-III' in the semiconductor device 100 of FIG. 4.

Hereinafter, a semiconductor device 100 to be simulated will be described.

Referring to FIGS. 4, 6 and 7, the semiconductor device 100 to be simulated may be a MOS transistor and the semiconductor device 100 may include a semiconductor substrate 101, a device isolation region 110, an active region 120, a gate insulating layer (or a gate oxide layer) 161, and a gate electrode 130.

The semiconductor substrate 101 may be, for example, a silicon substrate or a silicon on insulation (SOI) substrate. The device isolation region 110 includes a trench 113, and an insulation pattern 111 formed in the trench 113. In an exemplary embodiment, the device isolation region 110 may be formed in a shallow trench isolation (STI) structure having relatively good device isolating characteristics and occupying a reduced area, which may allow for high integration.

The insulation pattern 111 includes a dent 112 recessed toward a lower portion of the trench 113. The dent 112 is positioned near edge portions 121 of the active region 120. The dent 112 may prevent the edge portions 121 of the active region 120 from being covered by the insulation pattern 111.

Referring to FIG. 8, as reference numeral 180 indicates, the gate insulation layer 161 has a first thickness t1 at the center of the active region 120 and other portions of the active region 120 not at the edge portions 121 of the active region 120, and has a second thickness t2 at the edge portions 121 of the active region 120. In other words, the gate insulation layer 161 has a different thickness at the edge portion 121 of the active region 120, which corresponds to a boundary portion of the device isolation region 110 and the active region 120, than at those portions of the active region 120 not at the edge portions 121. For example, an edge thinning phenomenon may occur to the edge portions 121 of the active region 120, so that the thickness t2 of the gate insulation layer 161 at the edge portions 121 of the active region 120 is less than the thickness t1 of the gate insulation layer 161 at the remaining portions of the active region 120.

The insulation pattern 111 includes an insulating material, for example, an oxide. In addition, the insulation pattern 111 may be stacked by, for example, ozone-tetra ortho silicate glass (TEOS), atmospheric pressure chemical vapor deposition (APCVD), plasma enhanced chemical vapor deposition (PECVD), and/or high density plasma chemical vapor deposition (HDP CVD).

In addition, in order to improve device-device insulation capability, the insulation pattern 111 may include a trench insulation layer and a trench liner. The trench insulation layer and the trench liner may be conformally formed on an inner wall of the trench 113. The trench insulation layer may facilitate adhering of the insulation pattern 111 filling the trench 113 to the inner wall of the trench 113. In addition, the trench insulation layer may compensate for damage done to a silicon lattice on the inner wall of the trench 113 due to etching, by preventing leakage current of the insulation pattern 111 filling the trench 113 from increasing. The trench insulation layer may be formed of an oxide layer, for example, a silicon oxide ($SiO_2$) layer.

The trench liner may prevent the insulation pattern 111 and the trench insulation layer from being over-etched when the insulation pattern 111 is formed in the trench 113. Accordingly, the device isolation region 110 having an improved device isolating characteristics can be formed.

The device isolation region 110 having an STI structure surrounds the active region 120. Thus, the edge portions of the active region 120 face the device isolation region 110. The gate electrode 130 is formed on the device isolation region 110 and the active region 120. One end of the gate electrode 130 is positioned on a first side of the device isolation region 110 and another end of the gate electrode 130 is positioned on a second side of the device isolation region 110, facing and opposite to the first side of the device isolation region 110. The gate electrode 130 extends across the active region 120 and overlaps the active region 120. The gate electrode 130 may include, for example, poly-Si, poly-SiGe, a metal such as Ta, TaN, TaSiN, TiN, Mo, Ru, Ni, or NiSi, or combinations thereof.

Since a portion of the gate electrode 130 is also formed on the device isolation region 110 and extends from the isolation region 110 to the active region 120, part of the gate electrode 130 is positioned on a boundary portion of the active region 120 and the device isolation region 110. Therefore, the gate electrode 130 is positioned on the dent 112 of the insulation pattern 111.

Referring to FIG. 5, the gate electrode 130 includes a center portion 131 and first and second end portions 132 and 133. The center portion 131 does not overlap the edge portions 121 and 122 of the active region 120, and the first and second end portions 132 and 133 overlap first and second edge portions 121 and 122 of the active region 120. The first end portion 132 overlaps the first edge portion 121 of the active region 120 and the second end portion 133 overlaps the second edge portion 122 of the active region 120 (FIG. 9). Therefore, a first corner transistor 171 may be formed at the first edge portion 121 of the active region 120 by the first end portion 132 and impurity regions 151 and 152 in portions of the active region 120. A second corner transistor 173 may be formed at the second edge portion 122 of the active region 120 by the second end portion 133 and the impurity regions 151 and 152. In addition, a flat transistor 172 may be formed between the first and second edge portions 121 and 122 of the active region 120 by the center portion 131 and the impurity regions 151 and 152.

The gate electrode 130 may have a first length L1 along a first direction D1 and the active region 120 may have a second length L2 along the first direction D1. The second length L2 is longer than the first length L1. The center portion 131 may have a first width W1 along a second direction D2 perpendicular to the first direction D1, a portion in which the first end portion 132 and the active region 120 overlap may have a second width W2 along the second direction D2, and a portion in which the second end portion 133 and the active region 120 overlap may have a third width W3 along the second direction D2. Therefore, each of the flat transistor 172, the first corner transistor 171, and the second corner transistor 173 may have a channel length corresponding to the first length L1. The flat transistor 172 may have a channel width corresponding to the first width W1, the first corner transistor 171 may have a channel width corresponding to the second width W2, and the second corner transistor 173 may have a channel width corresponding to the third width W3.

The gate insulation layer 161 is formed on the active region 120 overlapping the gate electrode 130 and the device isolation region 110. The gate insulation layer 161 is formed between the gate electrode 130 and the active region 120 and insulates the active region 120 and the gate electrode 130 from each other. The gate insulation layer 161 may include, for example, a thermal oxide layer or a silicon oxide layer (SiOx) made of, for example, flowable oxide (FOX), tonen silazene (TOSZ), undoped silicate glass (USG), boro silicate glass (BSG), phospho silicate glass (PSG), borophospho silicate glass (BSG), plasma enhanced tetra ethyl ortho silicate (PE-TEOS), fluoride silicate glass (FSG), and/or high density plasma (HDP).

Figure 10:
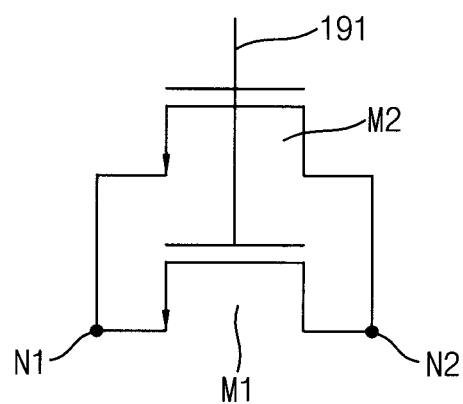
FIGS. 10 and 11 respectively illustrate a modeling of the semiconductor device to be simulated of FIG. 4.
Figure 11:
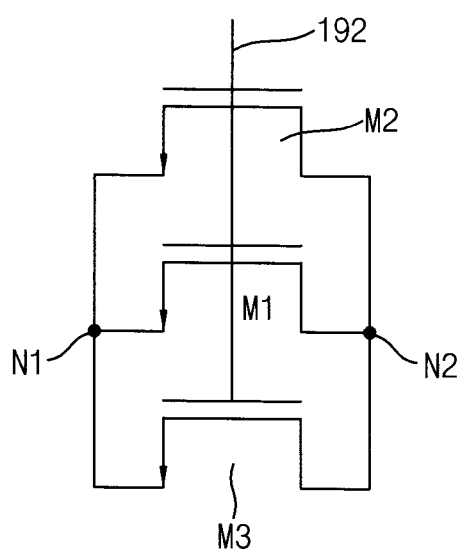

FIGS. 10 and 11 respectively illustrate a modeling of the semiconductor device 100 to be simulated of FIG. 4.

FIG. 10 illustrates that the semiconductor device 100 is modeled as a first transistor M1 and a second transistor M2, and FIG. 11 illustrates that the semiconductor device 100 is modeled as the first transistor M1, the second transistor M2, and a third transistor M3.

Hereinafter, a method of simulating a semiconductor device according to one or more exemplary embodiments will be described with reference to FIGS. 1 through 11.

According to a method of simulating a semiconductor device, the flat transistor 172 is modeled as the first transistor M1 via the input interface 20 of the simulation device 10 (operation S110). The flat transistor 172 is formed by the active region 120 defined by the device isolation region 110 in the semiconductor substrate 101, the gate electrode 130 across the active region 120 and the device isolation region 110, and the impurity regions 151 and 152 in the active region 120. The impurity regions 151 and 152 may be formed by injecting impurities in the active region 120. The flat transistor 172 is modeled as the first transistor M1 by inputting, via the input interface 20, a first device parameter of the flat transistor 172 to the memory 30. Here, the first device parameter may include at least the first channel width W1, the first channel length L1, and the first gate oxide thickness t1 of the flat transistor 172. The first device parameter may further include the thermal voltage, the carrier mobility, the gate oxide capacitance, the threshold voltage, the coefficient of the substrate biasing effect, the drain-to-source voltage, the substrate (bulk)-to-source voltage, and/or the Fermi level.

The at least one corner transistor 171 and/or 173 is modeled at least as the second transistor M2 (operation S130). The first corner transistor 171 may be formed by an overlapping of the gate electrode 130 (more particularly, the first end portion 132 of the gate electrode 130) and the first edge portion 121 of the active region 120. The first corner transistor 171 is modeled as the second transistor M2 by inputting, via the input interface 20, a second device parameter of the first corner transistor 171 to the memory 30. Here, the second device parameter may include at least the second channel width W2, the second channel length L1, and the second gate oxide thickness t2 of the corner transistor 171. The second device parameter may further include the thermal voltage, the carrier mobility, the gate oxide capacitance, the threshold voltage, the coefficient of the substrate biasing effect, the drain-to-source voltage, the substrate (bulk)-to-source voltage, and/or the Fermi level.

Electrical characteristics of the semiconductor device 100 may be simulated by calculating an output electrical signal (for example, the drain current Id) in response to an input electrical signal (for example, the gate-to-source voltage Vgs) applied to the first transistor M1 and the second transistor M2 by the processor 50 of the simulation device 10 (operation S150). The arithmetic unit 60 may calculate the output electrical signal based on the first device parameter and the second device parameter using the device model equation 34 such as Equation 1 through Equation 8 stored in the memory 30 under control of the controller 55. The calculated output electrical signal may be recorded as the simulated device characteristics 38 in the third file 37 of the memory 30 under control of the controller 55.

The calculated output electrical signal may be consecutively or non-consecutively displayed via the output interface 40 under control of the controller 55 (operation S170). When the output electrical signal is displayed via the output interface 40, actually measured data of the semiconductor device, stored in the memory 30, may be altogether displayed in the output interface 40 as the measured device characteristics 36.

When the first device parameter and the second device parameter are input to the memory 30 via the input interface 20, a ratio between the first transistor M1 and the second transistor M2 may be adjusted by adjusting some of the first device parameter and some of the second device parameter. In one or more exemplary embodiments, the ratio between the first transistor M1 and the second transistor M2 may be adjusted by adjusting the first channel width W1 of the first device parameter and the second channel width W2 of the second device parameter. In one or more other exemplary embodiments, the ratio between the first transistor M1 and the second transistor M2 may be adjusted by adjusting the first gate oxide thickness t1 of the first device parameter and the second gate oxide thickness t2 of the second device parameter, in addition to the first channel width W1 and the second channel width W2.

As illustrated in FIG. 10, the first transistor M1 and the second transistor M2 have a parallel configuration in which the first transistor M1 and the second transistor M2 share a gate electrode 191, sources of the first transistor M1 and the second transistor M2 are connected to each other at a first node N1, and drains of the first transistor M1 and the second transistor M2 are connected to each other at a second node N2. In addition, the electrical input signal, such as the gate-to-source voltage Vgs, is applied to the common gate 191, and the electrical output signal, such as the drain current Id, may be provided at the second node N2.

According to a method of simulating a semiconductor device 100, the second corner transistor 173 may be further modeled as the third transistor M3 via the input interface 20 as illustrated in FIG. 11. The second corner transistor 173 is formed by an overlapping of the gate electrode 130 (more particularly, the second end portion 133 of the gate electrode 130) and the second edge portion 122 of the active region 120. The corner transistor 173 is modeled as the third transistor M3 by inputting, via the input interface 20, a third device parameter of the second corner transistor 173 to the memory 30. Here, the third device parameter may include at least the third channel width W3, the third channel length L1, and the gate oxide thickness t2 of the corner transistor 173. The third device parameter may further include the thermal voltage, the carrier mobility, the gate oxide capacitance, the threshold voltage, the coefficient of the substrate biasing effect, the drain-to-source voltage, the substrate (bulk)-to-source voltage, and/or the Fermi level.

When the third device parameter is further input to the memory 30 via the input interface 20, a ratio between the first transistor M1 and the second and third transistors M2 and M3 may be adjusted by adjusting some of the first device parameter and some of the second and third device parameters. In one or more exemplary embodiments, the ratio between the first transistor M1 and the second and third transistors M2 and M3 may be adjusted by adjusting the first channel width W1 of the first device parameter, the second channel width W2 of the second device parameter, and the third channel width W3 of the third device parameter.

As illustrated in FIG. 11, the first transistor M1, the second transistor M2, and the third transistor M3 have a parallel configuration in which the first through third transistors M1, M2, and M3 share a gate electrode 192, sources of the first through third transistors M1, M2, and M3 are connected to each other at the first node N1, and drains of the first through third transistors M1, M2, and M3 are connected to each other at the second node N2. In addition, the electrical input signal, such as the gate-to-source voltage Vgs, is applied to the common gate 191, and the electrical output signal, such as the drain current Id, may be provided at the second node N2, and an electrical characteristic of the semiconductor device 100 may be simulated based on the electrical output signal. The electrical characteristic of the semiconductor device 100 may be a hump phenomenon of the semiconductor device 100.

As described above with reference to FIG. 8, a thickness of the gate insulation layer 161 is reduced at the edge portions 121 and 122 of the active region 120. For example, when an edge thinning, in which the thickness of the gate insulation layer 161 is reduced at the edge portions 121 and 122 of the active region 120, occurs to the first and second edge portions 121 and 122, an electrical field is concentrated on a thinned portion of the gate insulation layer 161, and the gate insulation layer 161 may deteriorate. Further, when a transistor is driven, channels at the first and second edge portions 121 and 122 of the active region 120, i.e., channels of the first and second corner transistors 171 and 173, are first formed and turned on, and a channel at the center of the active region 120, i.e., a channel of the flat transistor 171, is then formed and turned on. That is, a hump phenomenon in which a transistor appears to have two threshold voltages may occur. For example, the threshold voltage may be lowered at the edge portions 121 and 122 of the active region 120, that is, a boundary portion of the active region 120 and the device isolation region 110, thereby lowering stability of the transistor. In addition, a hump phenomenon may occur because well doping concentration may be light at edge portions of the device isolation region 110. The doping concentration may be light at the edge portions of the device isolation region 110 because of an oxidation enhanced diffusion (OED) phenomenon. Due to the OED phenomenon, a corner transistor having a lower threshold voltage appears at the edge portions of the device isolation region 110 to cause the hump phenomenon. This hump phenomenon become strong as a width of a transistor becomes narrow due to an inverse narrow width effect.

Since the related art simulation device cannot practically simulate the hump phenomenon, there is a huge difference between the actually measured device characteristics and the simulated device characteristics. However, according to one or more exemplary embodiments, the hump phenomenon may be practically simulated by modeling the corner transistors formed at the edge portions 121 and 122 of the active region 120 as at least the second transistor.

Figure 12:
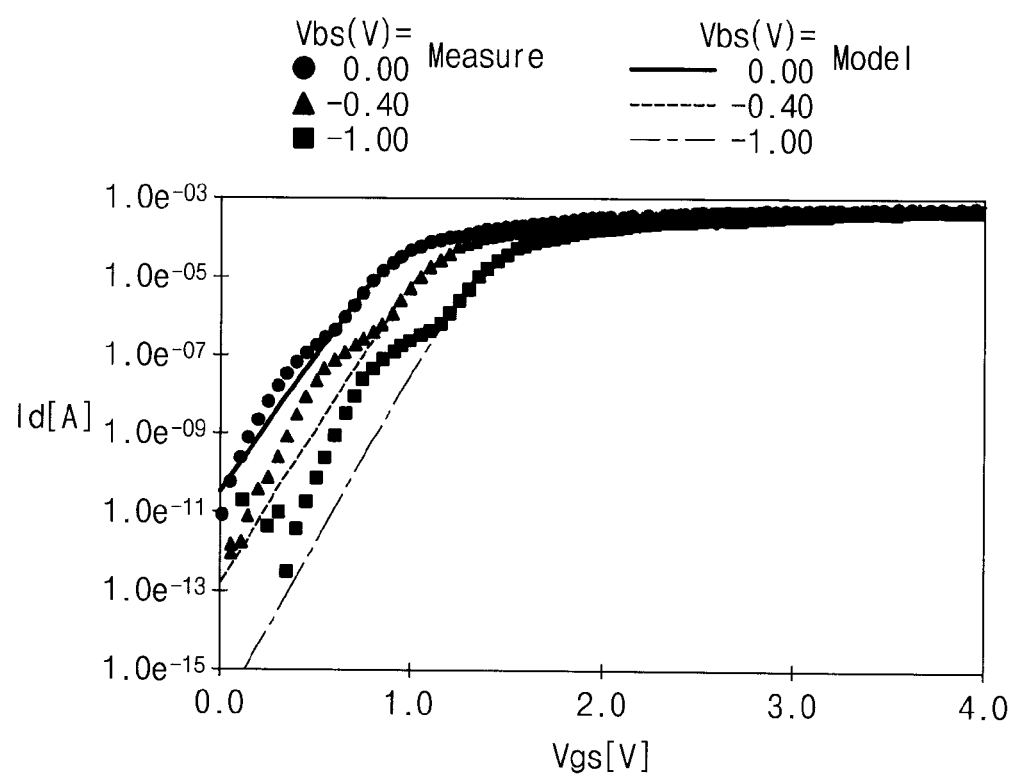
FIG. 12 is a graph illustrating electrical characteristics of a subject semiconductor device and a simulated semiconductor device according to comparative examples.

FIG. 12 is a graph illustrating electrical characteristics of a subject semiconductor device and a simulated semiconductor device according to comparative examples.

FIG. 12 illustrates electrical characteristics when the semiconductor device 100 of FIG. 4 is modeled as one flat transistor. In addition, FIG. 12 illustrates response characteristics of the drain current Id according to the gate-to-source voltage Vgs when the substrate (bulk)-to-source voltage varies. In FIG. 12, plane figures such as circles, triangles, and squares represent measured electrical characteristics of the semiconductor device 100 and lines such as a solid line, a dotted line, and an alternated long and short dash line represent measured electrical characteristics of the semiconductor device modeled as the one flat transistor.

Referring to FIG. 12, when the semiconductor device 100 of FIG. 4 is modeled as the one flat transistor without considering a corner transistor, there is a huge difference between the measured electrical characteristics (labeled as Measure) and the simulated electrical characteristics (labeled as Model). That is, the hump phenomenon is not properly reflected in the graph of FIG. 12.

Figure 13:
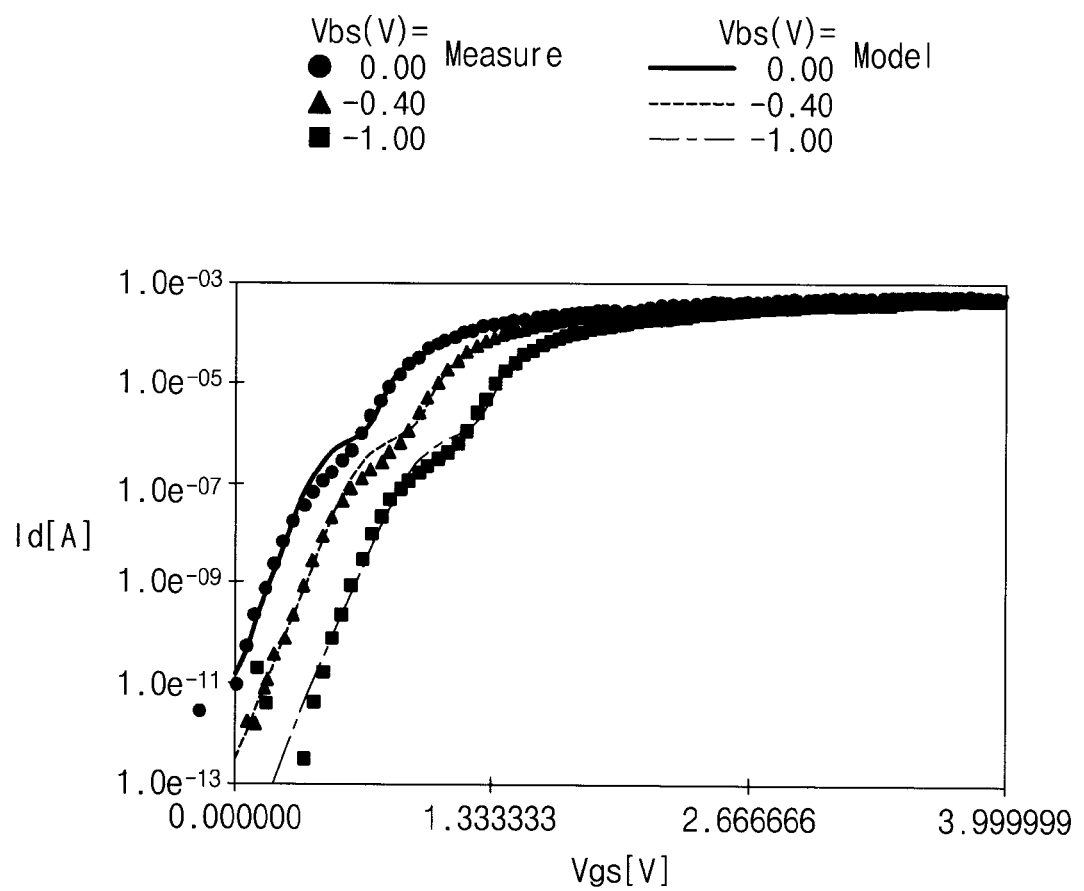
FIG. 13 is a graph illustrating electrical characteristics of a subject semiconductor device and a simulated semiconductor device according to a simulation method, according to an exemplary embodiment.

FIG. 13 is a graph illustrating electrical characteristics of a subject semiconductor device and a simulated semiconductor device according to a simulation method, according to an exemplary embodiment.

FIG. 13 illustrates electrical characteristics when the semiconductor device 100 of FIG. 4 is modeled as the first transistor M1 and the second and third transistors M2 and M3 as in FIG. 11. In addition, FIG. 13 illustrates response characteristics of the drain current Id according to the gate-to-source voltage Vgs when the substrate (bulk)-to-source voltage varies. In FIG. 13, plane figures such as circles, triangles, and squares represent measured electrical characteristics of the semiconductor device 100 and lines such as a solid line and a dotted line represent measured electrical characteristics of the semiconductor device modeled as the first through third transistors M1, M2, and M3.

Referring to FIG. 13, when the semiconductor device 100 of FIG. 4 is modeled as the first through third transistors M1, M2 and M3, there is a great similarity between the measured electrical characteristics (represented as Measure) and the simulated electrical characteristics (represented as Model). That is, the hump phenomenon is properly reflected in the graph of FIG. 13.

Figure 14:
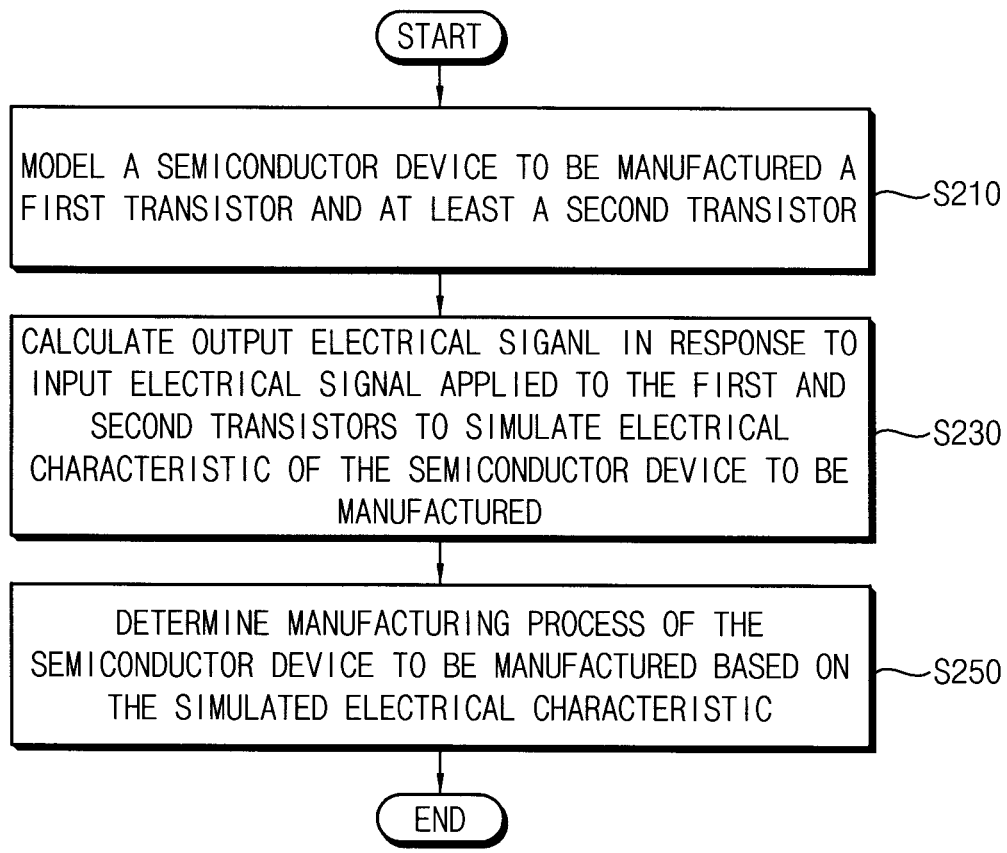
FIG. 14 is a flowchart illustrating a method of designing a semiconductor device according to an exemplary embodiment.

FIG. 14 is a flowchart illustrating a method of designing a semiconductor device according to an exemplary embodiment.

In a method of designing a semiconductor device in FIG. 14, the method of simulating the semiconductor device described with reference to FIGS. 1 through 11 is employed.

Referring to FIGS. 2, 4, 5, 10, 11, and 14, in a method of designing a semiconductor device 100, the semiconductor device 100 to be manufactured is modeled as the first transistor M1 corresponding to the flat transistor 172 and at least the second transistor M2 corresponding to the at least one corner transistor 171 and/or 173 by the input interface 20 of the simulation device 10 (operation S210). The flat transistor 172 is formed by the active region 120 defined by the device isolation region 110 in the semiconductor substrate 101, the gate electrode 130 across the active region 120 and the device isolation region 110, and the impurity regions 151 and 152 in the active region 120. The impurity regions 151 and 152 may be formed by injecting impurities in the active region 120. The flat transistor 172 is modeled as the first transistor M1 by inputting, via the input interface 20, the first device parameter of the flat transistor 172 to the memory 30. The at least one corner transistor 171 and/or 173 is modeled at least as the second transistor M2. The first corner transistor 171 may be formed by an overlapping of the gate electrode 130 (more particularly, the first end portion 132 of the gate electrode 130) and the first edge portion 121 of the active region 120. The first corner transistor 171 is modeled as the second transistor M2 by inputting, via the input interface 20, the second device parameter of the first corner transistor 171 to the memory 30.

The second corner transistor 173 may be further modeled as the third transistor M3 via the input interface 20 as in FIG. 11. The second corner transistor 173 is formed by an overlapping of the gate electrode 130 (more particularly, the second end portion 133 of the gate electrode 130) and the second edge portion 122 of the active region 120. The second corner transistor 173 is modeled as the third transistor M3 by inputting, via the input interface 20, the third device parameter of the second corner transistor 173 to the memory 30.

The electrical characteristics of the semiconductor device 100 may be simulated by calculating the output electrical signal (for example, the drain current Id) in response to an input electrical signal (the gate-to-source voltage Vgs) applied to the first transistor M1 and the second transistor M2 by the processor 50 of the simulation device 10 (operation S230). The arithmetic unit 60 may calculate the output electrical signal based on the first device parameter and the second device parameter using the device model equation 34 such Equation 1 through Equation 8 stored in the memory 30 under control of the controller 55. The calculated output electrical signal may be recorded as the simulated device characteristics 38 in the third file 37 of the memory 30 under control of the controller 55. A manufacturing process of the subject semiconductor device is determined based on the simulated electrical characteristics (operation S250). The simulated electrical characteristics may include the hump phenomenon of the subject semiconductor device 100.

Figure 15:
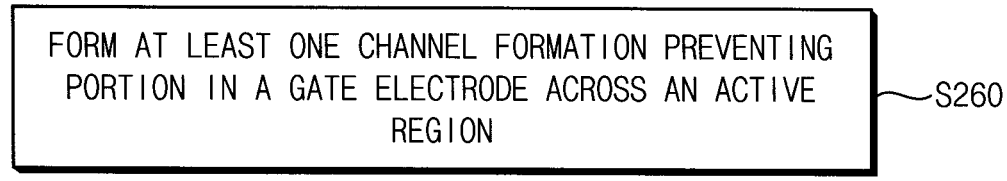
FIG. 15 is a manufacturing process that may be determined in operation S250 in FIG. 14.

FIG. 15 is a manufacturing process that may be determined in operation S250 of FIG. 14.

Referring to FIG. 15, at least one channel formation preventing portion may be formed in the gate electrode 130 across the active region 120 such that a channel is prevented from being formed at first and second edge portions 121 and 122 of the active region 120, based on the simulated electrical characteristics for relaxing the hump phenomenon (operation S260).

Figure 16:
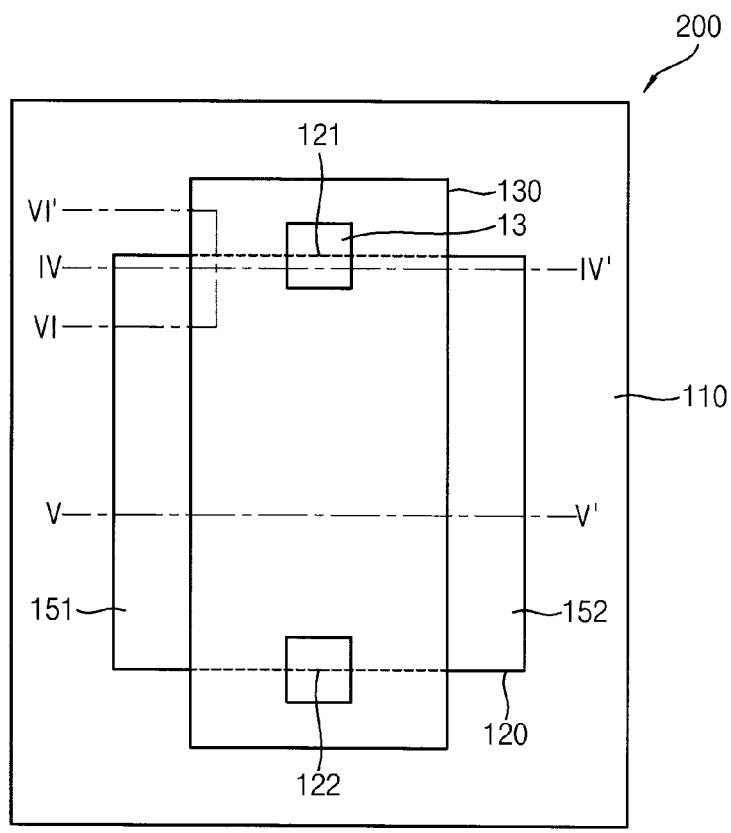
FIG. 16 is a plan view of a semiconductor device manufactured according to a designing method of FIGS. 14 and 15.

FIG. 16 is a plan view of a semiconductor device 200 manufactured according to the designing method of FIGS. 14 and 15.

FIGS. 17 through 23 illustrate various operations of manufacturing the semiconductor device 200 of FIG. 16.

Figure 17:
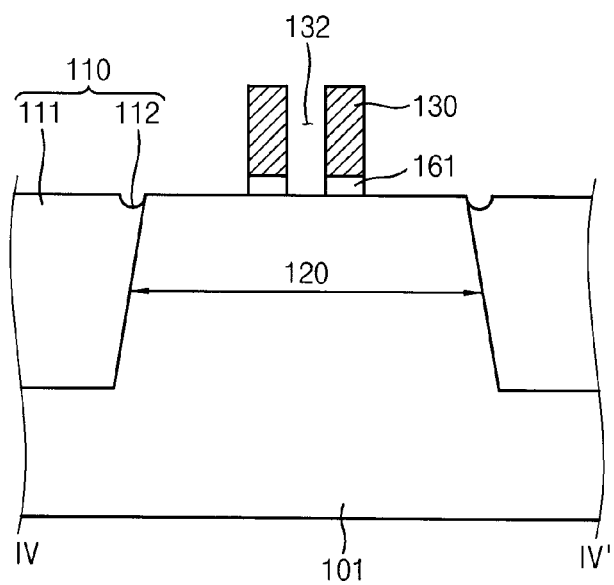
FIGS. 17 through 23 illustrate various operations of manufacturing the semiconductor device of FIG. 16.
Figure 18:
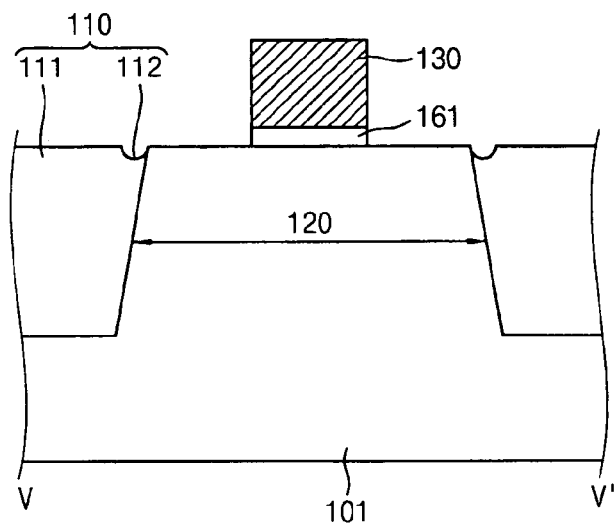
Figure 19:
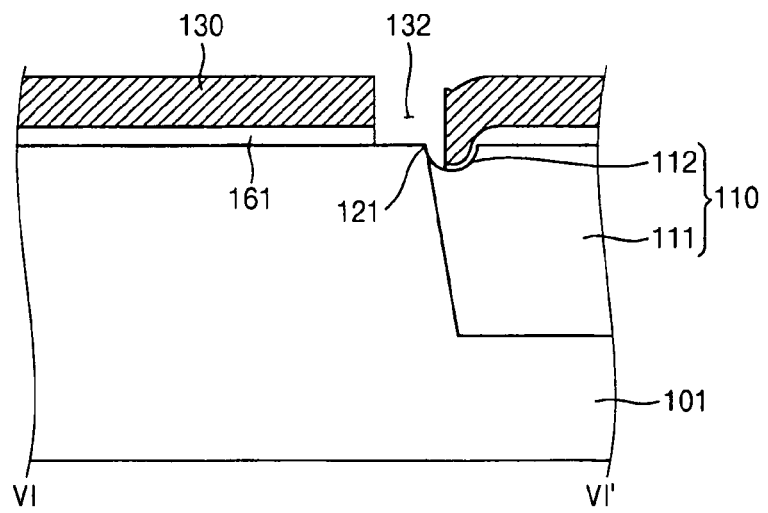

FIG. 17 is a cross-sectional view taken along a line IV-IV' in the semiconductor device 200 of FIG. 16, FIG. 18 is a cross-sectional view taken along a line V-V' in the semiconductor device 200 of FIG. 16, and FIG. 19 is a cross-sectional view taken along a line VI-VI' in the semiconductor device 200 of FIG. 16.

In FIGS. 17 through 23, the same reference numerals are used to designate the same or similar components in FIGS. 4 through 9, and redundant description are omitted.

Referring to FIG. 16, a semiconductor device 200 may further include at least one channel formation preventing portion 13 formed in the gate electrode 130, as compared to the semiconductor device 100 of FIG. 4.

Referring to FIGS. 16 through 19, at least one gate electrode opening portion 132 is formed in the gate electrode 130. In addition, the gate electrode opening portion 132 overlaps the edge portions 121 and 122 of the active region 120. A transistor is formed in the active region 120 during a subsequent process. As a result, even if a threshold voltage is applied to the gate electrode 130, the gate electrode opening portion 132 prevents the threshold voltage from being applied to the edge portions 121 and 122 of the active region 120, and a channel is not formed at the edge portions 121 and 122 of the active region 120. In other words, the gate electrode opening portion 132 operates as a channel formation preventing portion 13 that prevents a channel from being formed at the edge portions 121 and 122 of the active region 120.

The gate electrode opening portion 132 and the gate electrode 130 may be formed at the same time. For example, the gate electrode opening portion 132 may be formed using the same mask at the same time when the gate electrode 130 is formed by patterning a gate electrode forming conductive layer. A gate insulation layer forming insulation layer is patterned using the mask to form the gate electrode 130 and the gate electrode opening portion 132 and, according to an exemplary embodiment, a portion of the gate insulation layer 161 overlapping the gate electrode opening portion 132 is removed. Thus, a portion of the active region 120 overlapping the gate electrode opening portion 132, the edge portion 121 of the active region 120, and a portion of the device isolation region 110 is exposed through the gate electrode opening portion 132.

As described above, the gate electrode 130, the gate insulation layer 161, and the gate electrode opening portion 132 may be formed using a single mask. Therefore, it is not necessary to provide an additional mask for forming the gate electrode opening portion 132.

Figure 20:
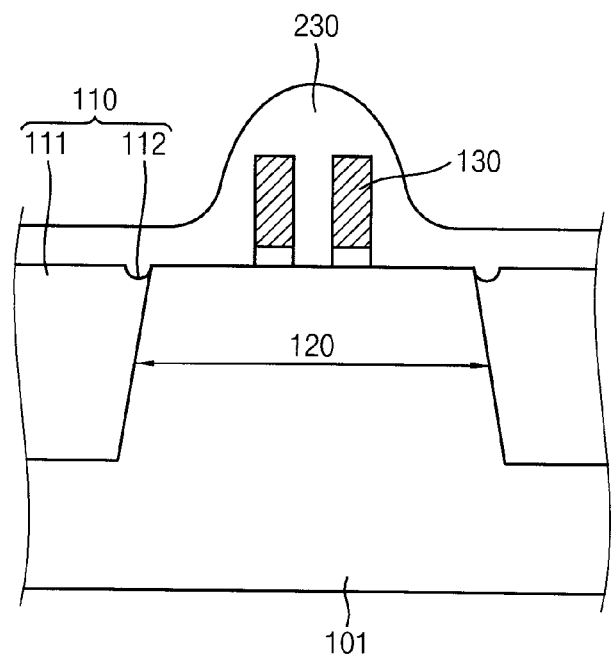

Referring to FIG. 20, a spacer forming material layer 230 is formed on the resultant product of FIGS. 17 through 19. The spacer forming material layer 230 may be formed of, for example, silicon oxide, and deposited by chemical vapor deposition (CVD). The gate electrode opening portion 132 is also filled with silicon nitride.

Figure 21:
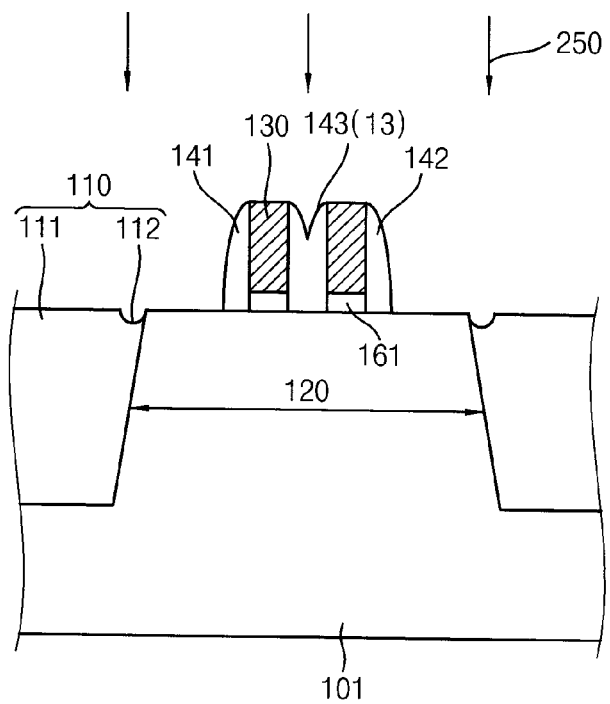
Figure 22:
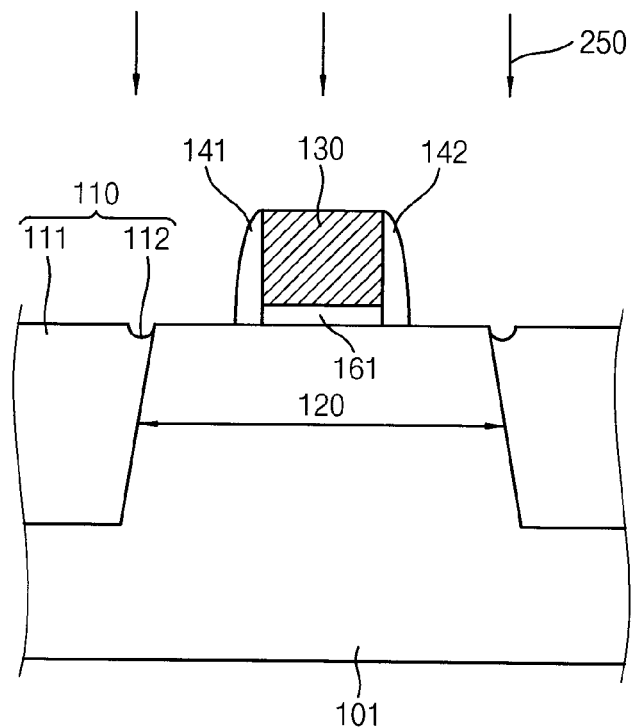
Figure 23:
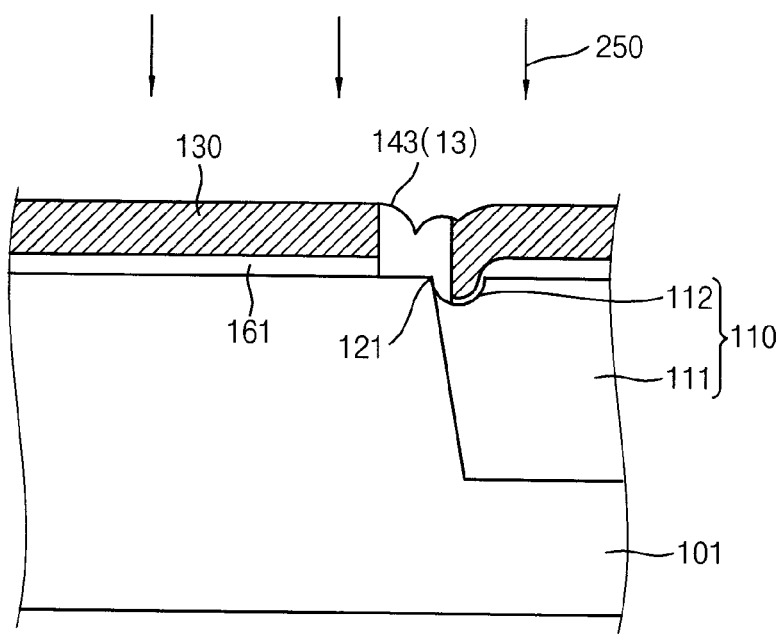

Referring to FIGS. 21 through 23, the spacer forming material layer 230 is etched back to form spacers 141 and 142 at opposite sides of the gate electrode 130. In addition, a spacer pattern 143 filling the gate electrode opening portion 132 is formed. Accordingly, a channel formation preventing portion 13 including the gate electrode opening portion 132 and the spacer pattern 143 is formed.

Next, an impurity 250 of the Group III or V elements of the Periodic Table is injected into the active region 120 to form source and drain regions 151 and 152. The impurity 250 may be injected into the portion of the active region 120 that is not overlapped with the gate electrode 130, the spacers 141 and 142, and the channel formation preventing portion 13. In other words, the impurity is not injected into the active region 120 that is overlapped with the gate electrode 130, the spacers 141 and 142, and the spacer pattern 143 of the channel formation preventing portion 13. Accordingly, the source and drain regions 151 and 152 are formed at opposite sides of the gate electrode 130 in parallel with a direction in which the gate electrode 130 extends.

As described above with reference to FIG. 8, a thickness of the gate insulation layer 161 is reduced at the edge portions 121 and 122 of the active region 120. For example, when an edge thinning, in which the thickness of the gate insulation layer 161 is reduced at the edge portions 121 and 122 of the active region 120, occurs to the edge portions 121 and 122, an electric field is concentrated on a thinned portion of the gate insulation layer 161, and the gate insulation layer 161 may deteriorate. Further, when a transistor is driven, channels at the edge portions 121 and 122, i.e., channels of corner transistor 171 and 173, are first formed and turned on, and a channel at the center of the active region 120, i.e., a channel of a flat transistor 172, is then formed and turned on. That is to say, a hump phenomenon in which a transistor appears to have two threshold voltages may occur. For example, the threshold voltage is lowered at the edge portion 121 of the active region 120, that is, a boundary portion of the active region 120 and the device isolation region 110, thereby lowering stability of the transistor.

However, in the semiconductor device 200 according to an exemplary embodiment, since the channel formation preventing portion 13 is formed at a portion of the gate electrode 130 overlapping the edge portions 121 and 122 of the active region 120, it is possible to prevent a channel from being formed at the edge portions 121 and 122 of the active region 120, thereby preventing the hump phenomenon in which a transistor appears to have two threshold voltages.

Figure 24:
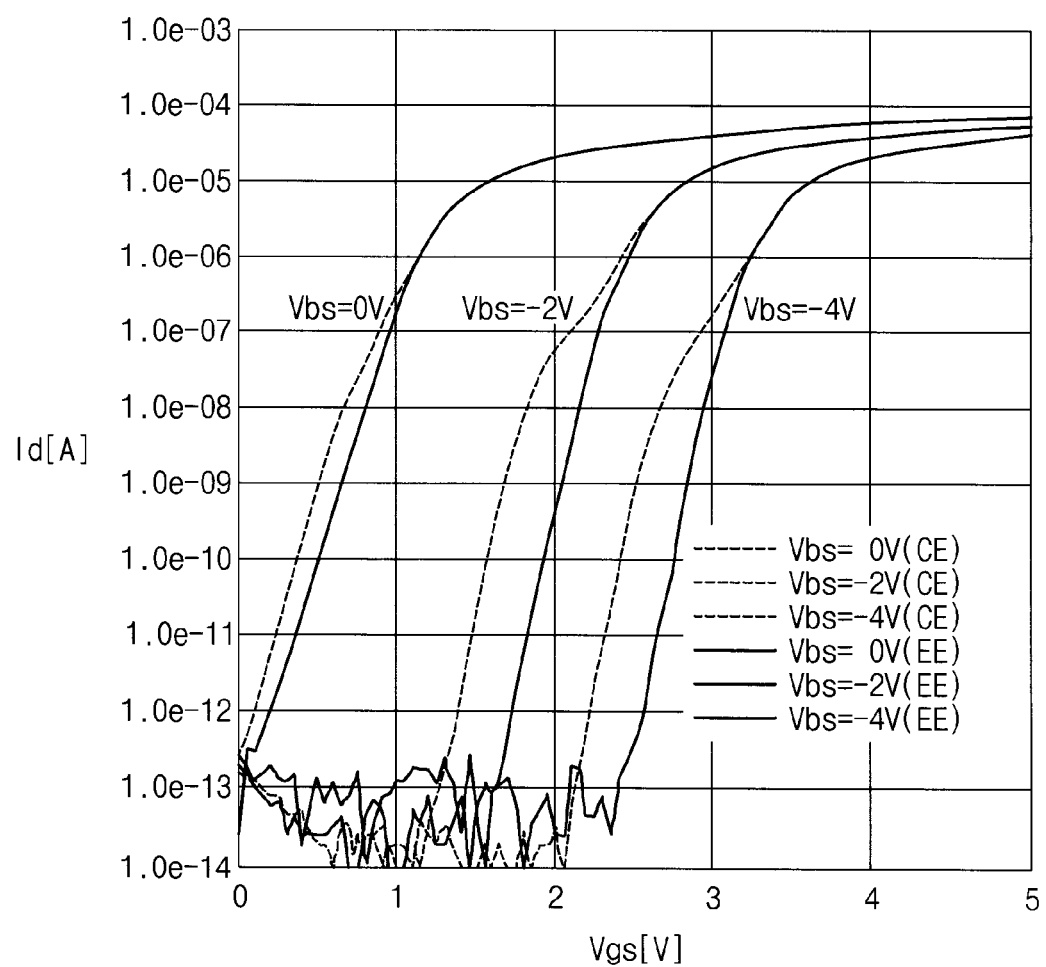
FIG. 24 is a graph for comparing electrical characteristics of a transistor of a semiconductor device according to an exemplary embodiment and a transistor of a comparative semiconductor device.

FIG. 24 is a graph for comparing electrical characteristics of a transistor of a semiconductor device according to an exemplary embodiment (labeled as EE meaning exemplary embodiment) and a transistor of a comparative semiconductor device (labeled as CE meaning comparative example). The channel formation preventing portion is not included in the transistor of a semiconductor device used for the comparative examples.

Referring to FIG. 24, assuming that a gate-on current Id is 1.0E-09, a gate-on voltage Vg of the transistor of a semiconductor device according to one or more exemplary embodiments is moved to the right, compared to a gate-on voltage Vg of the transistor of a semiconductor device according to the comparative examples. In other words, a threshold voltage of the transistor of the semiconductor device according to one or more exemplary embodiments is not reduced while a threshold voltage of the transistor of the semiconductor device according to the comparative examples is reduced. Accordingly, the transistor of the semiconductor device according to one or more exemplary embodiments can prevent occurrence of a hump phenomenon.

Figure 25:
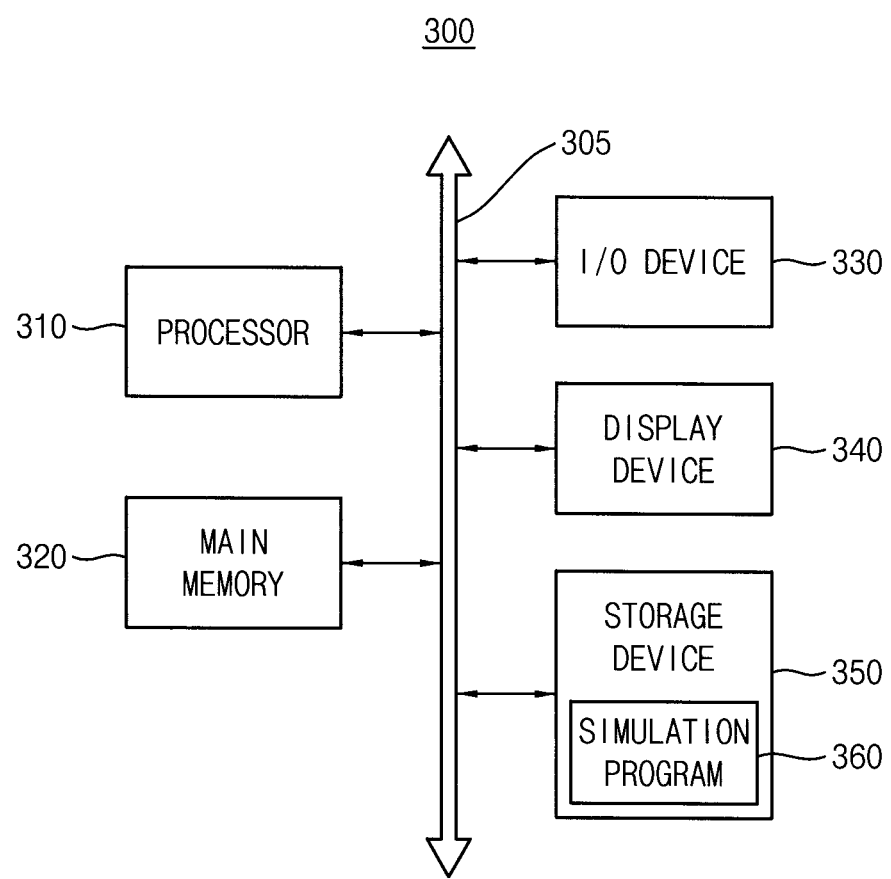
FIG. 25 is a block diagram illustrating a computing system according to an exemplary embodiment.

FIG. 25 is a block diagram illustrating a computing system 300 according to an exemplary embodiment.

Referring to FIG. 25, a computing system 300 includes a processor 310, a main memory 320, an input/output (I/O) device 330, a display device 340, and a storage device 350. The processor 310, the main memory 320, the I/O device 330, the display device 340, and the storage device 350 may be connected to each other via a system bus 305.

The processor 310 may be implemented by a single core processor or a multi-core processor, and may be implemented as one or more hardware processors. The I/O device 320 may be a keyboard, a mouse, a printer, an interface to connect to an external device, etc. The main memory 320 may be a dynamic random-access memory (DRAM) or a static random-access memory (SRAM). The display device 340 may be a display device such as a liquid crystal display (LCD) device, a light emitting diode (LED) device, an organic LED (OLED) device, a cathode ray tube (CRT) device, a plasma display panel, an active-matrix OLED device, etc. The storage device 350 may be a hard disk drive (HDD), a solid state drive (HDD), etc. The storage device 350 may store the simulation method of FIG. 1 or the designing method of FIG. 14 as a computer-readable program code 360. The program code 360 is loaded to the main memory 320, the loaded program code 360 is executed by the processor 310, and the simulation result (that is, executed result) may be output by the display device 340. That is, when the program code 360 is executed in the main memory 320 by the processor 310, a user may input the device parameters of the flat transistor and the corner transistor through the I/O device 310, and the processor 310 may perform simulation based on the device parameters and may output the simulation result through the I/O device 330 or may display the simulation result in the display device 340. That is, the graph as in FIG. 24 may be displayed by the display device 340. While the present exemplary embodiment describes a computing system 300 including a display device 340, it is understood that one or more other exemplary embodiments are not limited thereto. For example, a computing system according to another exemplary embodiment may omit the display device 340 and include an output interface connectable to an external display device through which the simulation result may be output. Furthermore, it is understood that the device parameters may be input through the I/O device 310 by an external device, rather than by a user.

According to one or more exemplary embodiments, the hump phenomenon of a subject semiconductor device may be reflected in the simulation by modeling a flat transistor and a corner transistor of the subject semiconductor device as a first transistor and a second transistor, respectively.

The above-described exemplary embodiments may be applied to simulation devices and simulation methods of various semiconductor devices and may be helpful in designing semiconductor devices.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more of the above-described elements can include circuitry, a processor, a microprocessor, etc., and may execute a computer program stored in a computer-readable medium.

While the present disclosure has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of simulating a semiconductor device, the method comprising:
   modeling, through an input interface of a simulation device, a flat transistor as a first transistor, wherein the flat transistor is formed by an active region defined by an isolation region on a semiconductor substrate of the semiconductor device, a gate electrode extending from the isolation region across the active region, and an impurity region in a portion of the active region;
   modeling, through the input interface, a first corner transistor as a second transistor, wherein the first corner transistor is formed adjacent to the flat transistor by an overlapping of the gate electrode and a first edge portion of the active region; and
   calculating, by a processor of the simulation device, an electrical output signal in response to an electrical input signal applied to the first transistor and the second transistor to simulate at least one electrical characteristic of the semiconductor device.

2. The method of claim 1, wherein:
   the modeling the flat transistor as the first transistor comprises inputting, through the input interface, a first device parameter of the flat transistor to a memory of the simulation device; and
   the modeling the first corner transistor as the second transistor comprises inputting, through the input interface, a second device parameter of the first corner transistor to the memory.

3. The method of claim 2, wherein the first device parameter comprises a first channel width, a first channel length, and a first gate oxide thickness of the flat transistor.

4. The method of claim 2, wherein the second device parameter comprises a second channel width, a second channel length, and a second gate oxide thickness of the first corner transistor, the second gate oxide thickness being less than a first gate oxide thickness of the flat transistor.

5. The method of claim 2, further comprising adjusting a ratio between the first transistor and the second transistor by adjusting, through the input interface, a first channel width of the first device parameter and a second channel width of the second device parameter.

6. The method of claim 2, further comprising:
   modeling, through the input interface, a second corner transistor as a third transistor, wherein the second corner transistor is formed by an overlapping of the gate electrode and a second edge portion of the active region, opposite to the first edge portion of the active region.

7. The method of claim 6, wherein the modeling the second corner transistor as the third transistor comprises inputting, through the input interface, a third device parameter of the second corner transistor to the memory.

8. The method of claim 7, further comprising adjusting a ratio between the first transistor and the second and third transistors by adjusting, through the input interface, a first channel width of the first device parameter, a second channel width of the second device parameter, and a third channel width of the third device parameter.

9. The method of claim 1, wherein the semiconductor device is a metal-oxide semiconductor (MOS) transistor and the at least one electrical characteristic comprises a hump phenomenon of the MOS transistor.

10. The method of claim 1, wherein the electrical input signal corresponds to a voltage applied by the processor to a common gate of the first transistor and the second transistor, and the electrical output signal corresponds to a drain current in response to the voltage.

11. The method of claim 1, further comprising:
    displaying the calculated electrical output signal through an output interface of the simulation device.

12. A method of designing a semiconductor device to be manufactured, the method comprising:
    modeling, through an input interface of a simulation device, the semiconductor device as a first transistor and a second transistor, the first transistor corresponding to a flat transistor in a center portion of an active region of the semiconductor device, and the second transistor corresponding to a first corner transistor in a first edge portion of the active region;
    calculating, by a processor of the simulation device, an electrical output signal in response to an electrical input signal applied to the first transistor and the second transistor to simulate at least one electrical characteristic of the semiconductor device; and
    determining a manufacturing process of the semiconductor device to be manufactured based on the simulated at least one electrical characteristic,
    wherein the flat transistor does not extend over the first edge portion of the active region.

13. The method of claim 12, wherein the semiconductor device to be manufactured is a metal-oxide semiconductor (MOS) transistor and the at least one electrical characteristic comprises a hump phenomenon of the MOS transistor.

14. The method of claim 13, wherein the determining the manufacturing process comprises determining to form at least one channel formation preventing portion in a gate electrode across the active region such that a channel is prevented from being formed at the first edge portion of the active region.

15. The method of claim 12, wherein the modeling comprises:
    modeling, through the input interface, a third transistor in addition to the first transistor and the second transistor, the third transistor corresponding to a second corner transistor at a second edge portion of the active region; and
    adjusting a ratio between the first transistor and the second and third transistors by inputting, through the input interface, a first device parameter of the first transistor, a second device parameter of the second transistor, and a third device parameter of the third transistor to a memory of the simulation device.

16. An apparatus for simulating a semiconductor device, the apparatus comprising:
    an input interface configured to receive a first input to model a first transistor and a second input to model second transistor; and
    a processor configured to calculate an electrical output signal in response to an electrical input signal applied to the first transistor and the second transistor to simulate at least one electrical characteristic of the semiconductor device,
    wherein the first transistor corresponds to a flat transistor in a center portion of an active region of the semiconductor device, and the second transistor corresponds to a first corner transistor in a first edge portion of the active region.

17. The apparatus of claim 16, wherein:
    the input interface is configured to receive a first device parameter to model the flat transistor as the first transistor, and to receive a second device parameter to model the first corner transistor as the second transistor;

the first device parameter comprises a first channel width, a first channel length, and a first gate oxide thickness of the flat transistor; and the second device parameter comprises a second channel width, a second channel length, and a second gate oxide thickness of the first corner transistor.

18. The apparatus of claim 17, wherein:

the input interface is configured to receive a third input to model a third transistor, the third transistor corresponding to a second corner transistor at a second edge portion of the active region; and the processor is configured to calculate an output electrical signal in response to an input electrical signal applied to the first transistor, the second transistor, and the third transistor to simulate the at least one electrical characteristic of the semiconductor device.

19. The apparatus of claim 16, wherein the semiconductor device is a metal-oxide semiconductor (MOS) transistor and the at least one electrical characteristic comprises a hump phenomenon of the MOS transistor.

20. The apparatus of claim 16, wherein the electrical input signal corresponds to a voltage applied by the processor to a common gate of the first transistor and the second transistor, and the electrical output signal corresponds to a drain current in response to the voltage.

* * * * *